United States Patent [19]

Black

[11] 4,055,777
[45] Oct. 25, 1977

[54] WINDOW COMPARATOR

[75] Inventor: James M. Black, Quartz Hill, Calif.

[73] Assignee: The United States of America as represented by the Administrator of the National Aeronautics and Space Administration, Washington, D.C.

[21] Appl. No.: 737,974

[22] Filed: Nov. 2, 1976

[51] Int. Cl.² ............................................. H03K 5/153
[52] U.S. Cl. .................................... 307/360; 307/350; 307/265; 328/150
[58] Field of Search ............... 307/350, 360, 362, 265; 328/20, 150

[56] References Cited

U.S. PATENT DOCUMENTS

| | | | |
|---|---|---|---|
| 3,753,012 | 8/1973 | Frederiksen et al. | 307/360 |
| 3,879,662 | 4/1975 | Barneck | 307/362 |
| 3,890,575 | 6/1975 | Tawfif | 307/362 |
| 3,999,084 | 12/1976 | Beadette | 307/360 |

Primary Examiner—John S. Heyman

Attorney, Agent, or Firm—Monte F. Mott; Paul McCaul; John R. Manning

[57] ABSTRACT

A window comparator comprising two operational amplifiers, a first one with two feedback circuits, each feedback circuit having a diode connected to the amplifier output and poled for forward current conduction of opposite polarity, to provide an algebraic difference between an input signal and a selected set-point voltage such that one diode conducts and then switches off while the other is held off and then conducts when the sign of the algebraic difference switches. Differential input terminals of the second operational amplifier are connected to the separate feedback circuits of the first operational amplifier, one input terminal to the output of one diode, and the other to the output of the other diode. A selected window-width voltage is connected through a coupling resistor to one of the input terminals of the second operational amplifier to determine when the algebraic difference of the input signal and the set-point voltage has exceeded a predetermined tolerance after that difference has changed signs.

6 Claims, 4 Drawing Figures

WINDOW COMPARATOR

ORIGIN OF INVENTION

The invention described herein was made by an employee of the U.S. Government and may be manufactured and used by and for the Government for Governmental purposes without the payment of any royalties thereon or therefor.

BACKGROUND OF THE INVENTION

This invention relates to a circuit for determining when a voltage falls between preselected upper and lower voltage limits.

Many applications, such as in voltage controlled processes, instrumentation and checkout (or verification) functions, sometimes require an accurate means for determining when the control voltage is within a preselected range of voltage levels, as opposed to the more simple case of determining if the voltage is above or below a single preselected level. The circuit for the latter is commonly referred to simply as a "comparator," while for the former, more complex case, it is commonly called a "window comparator." A typical application for a window comparator is to check the feedback signal ($V_{FB}$) of a servomechanism to determine that it has been positioned to a preselected position (V) within a tolerance $\pm(\Delta V/2)$.

A window comparator transmits an output voltage or current signal at a predetermined level only when the input voltage is between two selected levels. At all other times the voltage or current signal transmitted by the window comparator is at another level. A simple check of the output signal level with then indicate the state of the input signal vis-a-vis the selected set point $V \pm \Delta V/2$, where $\Delta V$ is the selected window width. For that reason a window comparator is sometimes said to have a "go-no-go" range, while a simple comparator is said to have a "go-no-go" point.

In the past, a window comparator has been implemented with two simple comparators, one biased at the lower limit level and one biased at the upper limit level. The outputs of the two simple comparators are then connected to provide a wired OR output that is of a first level whenever the range is exceeded, and of a second level whenever the range is not exceeded. A problem with this parallel-comparator approach is the difficulty in maintaining stable reference levels, particularly when a narrow window is involved. If the two references should drift in opposite directions, the window becomes too large, or too small. In the case of both drifting toward each other, there may be no window left at the time the comparator output is checked for a go-no-go decision. Such independent drifting of the reference levels occurs due to changes in ambient temperature, aging of components and other environmental factors. The hysteresis of the simple comparators themselves will also affect the window size.

For the application which requires a narrow window, e.g. 10 millivolts, within a possible 10 volt range, the upper and or lower limits of the window must be maintained to within one part in 10,000 to maintain the window width to within 10% of the present value. The same window stability may be obtained by the present invention in which the input signal is first compared with a set point voltage, $V$, to determine when the input signal first enters the window range, $V + \Delta V$, and then comparing the excess of the input signal over the set point level with the window, $\Delta V$. This permits setting the window, $\Delta V$, to within just one part in ten, instead of to within one part in 10,000.

A tandem window comparator Model 4021/25 has been commercially available from Burr-Brown Research Corporation, but it is comprised of two operational amplifiers in a circuit which provides an output signal proportional to the absolute value of difference between the input signal and a reference voltage. The output of the absolute value circuit is then compared with the window voltage, $\Delta V$. While such a tandem arrangement of an absolute value circuit with a simple comparator may permit setting the window to within one part in less than 10,000, or even to within one part in ten, it requires three operational amplifiers, and four diodes: two operational amplifiers and two rectifying diodes for the absolute value circuit, and one operational amplifier and two clamping diodes for the window comparator. The present invention requires only two operational amplifiers and two switching diodes. Moreover, it does not allow independent setting of the reference voltage as the present invention does. This is an important difference since adjustment of the reference voltage in the Burr-Brown circuit varies the window level and window width. This makes settings more difficult and complex to make, particularly for remote operation.

SUMMARY OF THE INVENTION

In accordance with the invention, a first means, comprising a single operational amplifier connected to algebraically subtract an input signal from a selected set-point voltage, is provided to determine when the input signal has exceeded the set point, and a second means, comprising a single operational amplifier is provided to algebraically subtract the difference output of the first means from a selected window-width voltage.

In a preferred embodiment of the present, the first operational amplifier has an inverting input terminal connected to a summing junction and has two feedback circuits to the summing junction, one feedback circuit comprising a first diode in series with a resistor, the first diode having its anode connected to the output of the first operational amplifier, and the other feedback circuit comprising a second diode in series with a resistor, the second diode having its cathode connected to the output of the first operational amplifier. A first summing resistor couples an input signal to the summing junction and a second summing resistor couples a set-point voltage to the summing junction. The set-point voltage is selected for the set-point level at which the linear output of the first operational amplifier crosses from one polarity to another according to when the algebraic difference between the input signal and the set-point voltage changes polarity. The junction between the diode and feedback resistor in one feedback circuit is coupled to the inverting input terminal of the second operational amplifier having a differential input stage, and the junction between the diode and feedback resistor in the other feedback circuit is coupled to the noninverting input terminal of the second operational amplifier. A window-width voltage is connected by a coupling resistor to one of the two differential input terminals of the second amplifier to determine when the linear output of the first operational amplifier exceeds the window-width voltage by causing the output of the second operational amplifier to switch from a second predetermined voltage level back to a first predetermined voltage level when the output of the first operational amplifier has switched polarity and has exceeded the window-width voltage. In that manner the output of the second operational amplifier switches from the first level to the second level as the input signal decreases to the point where the output of the first operational amplifier reverses in polarity, and remains at the second level until the input signal drives the output of the first operational amplifier to a point where it exceeds the window-width voltage. It then switches back to the first level and remains there until the input signal increases sufficiently for the output of the first operational amplifier to decrease below the window-width voltage.

The novel features of the invention are set forth with particularity in the appended claims. The invention will best be understood from the following description when read in conjunction with the accompanying drawings.

DESCRIPTION OF PREFERRED EMBODIMENTS

Figure 1:
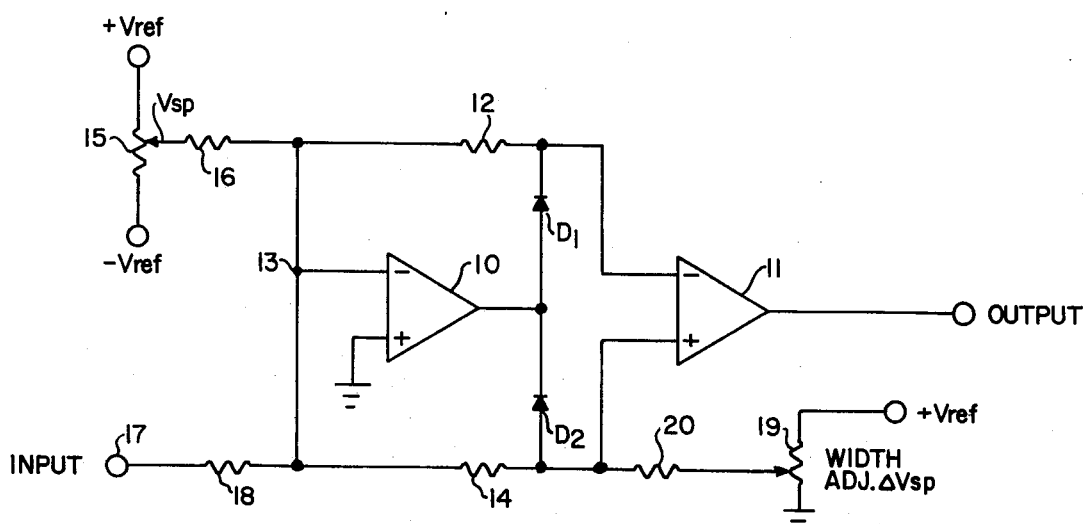
FIG. 1 illustrates a circuit diagram for an exemplary embodiment of the present invention.

Referring to FIG. 1, a preferred embodiment utilizes two amplifiers 10 and 11, and two silicon rectifying diodes $D_1$ and $D_2$. The first amplifier 10 is an inverting operational amplifier with feedback through the diode $D_1$ in series with a resistor 12 to a summing junction 13 and through the diode $D_2$ through a resistor 14 to the summing junction 13. A set-point adjustment is made in a potentiometer 15 connected between the positive and negative terminals of a reference voltage generator (not shown). The set point voltage is coupled to the summing junction by a summing resistor 16. An input signal at a terminal 17 is coupled to the junction by a summing resistor 18. For simplicity, the feedback resistors 12 and 14 are selected to have the same resistance (10K ohms) as the summing resistors 16 and 18. The internal resistance of the diodes conducting in a forward direction is so negligible as compared to the value of the feedback resistors as to not alter the 1:1 ratio of the feedback resistors to the summing resistors. Since the operational amplifier 10 is a high gain amplifier, negative feedback through resistors 12 and 14 will maintain the summing junction to within a few millivolts of circuit ground, i.e., at virtual ground potential.

Figure 2:
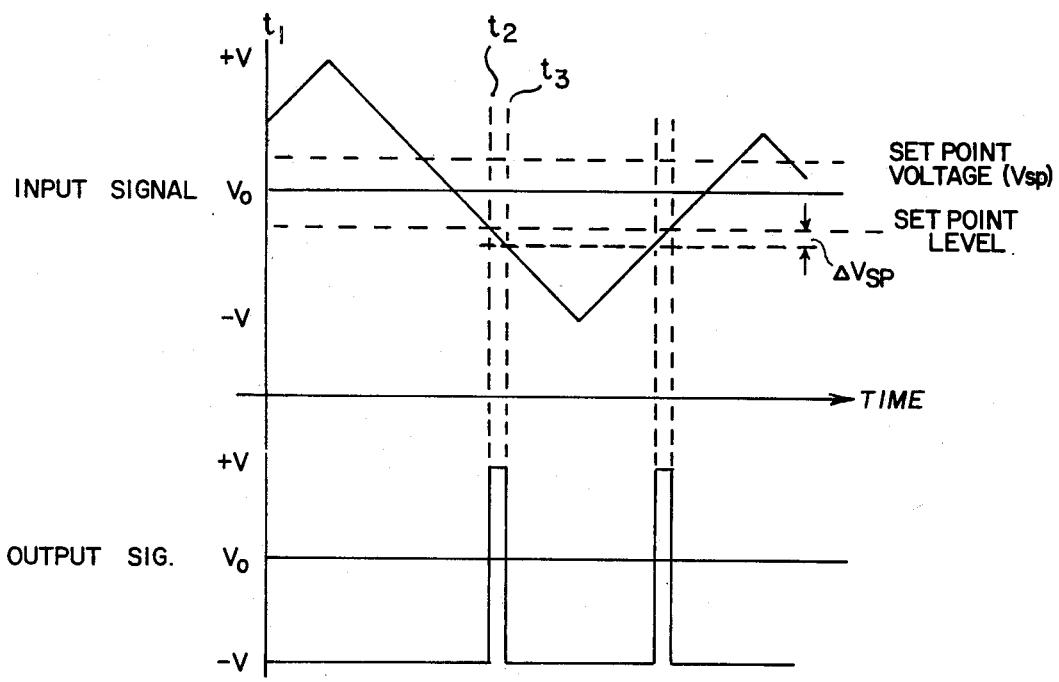
FIG. 2 is a voltage diagram illustrating the operation of the invention under various input signal conditions for a given set point and window width in the circuit of FIG. 1.
Figure 3:
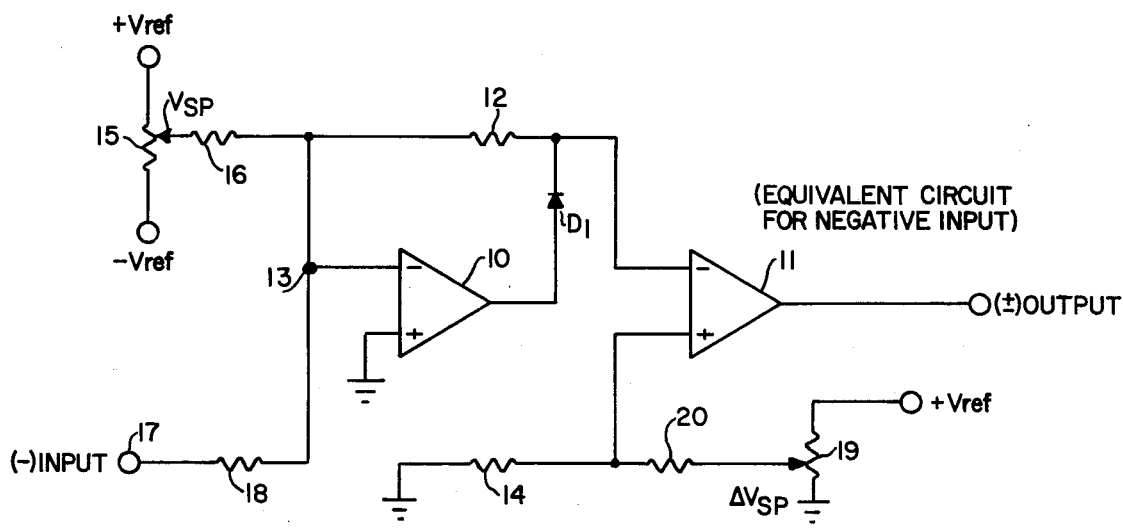
FIG. 3 illustrates an equivalent circuit diagram for the operation of the invention in the case of a negative input signal with respect to a set point.
Figure 4:
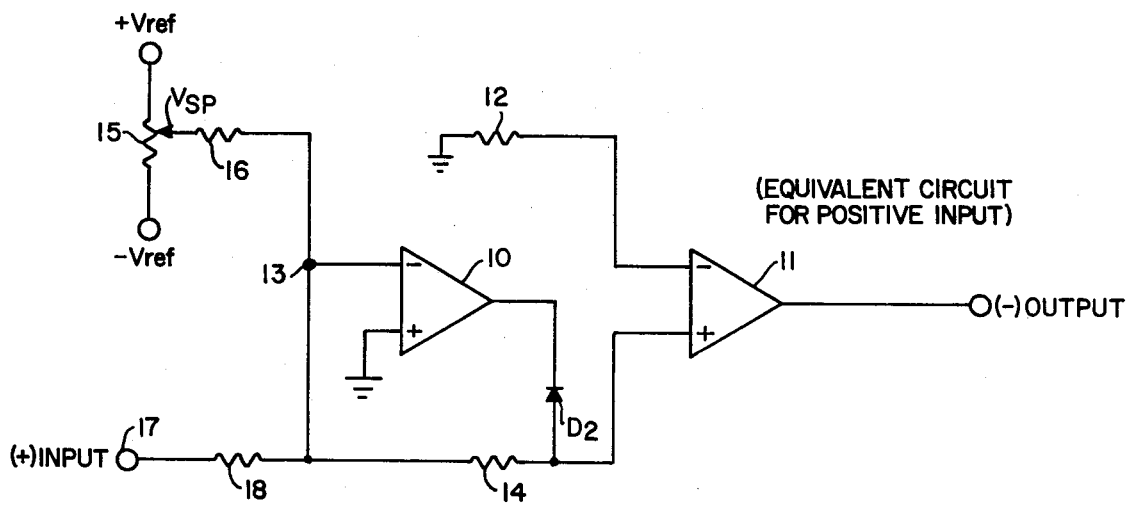
FIG. 4 illustrates an equivalent circuit diagram for the operation of the invention in the case of a positive input signal with respect to a set point.

When the algebraic difference ($V_{IN} - V_{SP}$) between the input signal and the set-point voltage is positive (because both the set point and the input are positive or because, while one is positive and the other is negative, the positive one is greater), a positive current flows into the inverting input of the amplifier. The output of the amplifier will then be driven to a negative potential sufficient to provide a negative current through the diode $D_2$ and feedback resistor 14 to maintain the summing junction 13 at virtual ground. When the algebraic sum of the set point and the input is negative, the polarity of the current into the inverting input terminal of the amplifier is reversed, thus driving the output of the amplifier to a positive potential sufficient to provide a positive current through the diode $D_1$ and feedback resistor 17 to maintain the summing junction 13 at virtual ground. The output of the amplifier 10 will be compared with a positive window-width voltage selected by a potentiometer 19, as will as described more fully with reference to FIG. 2. The output of the amplifier 10 is either a positive current to the summing junction proportional to the algebraic difference between the negative input signal and the set-point voltage, $+V_{SP}$, as shown in FIG. 3, or a negative current to the summing junction proportional to the algebraic difference between a positive input signal and the set-point voltage, as shown in FIG. 4. It should be noted that the term difference is here used advisedly because what is required of the operational amplifier is the difference between the input signal and the set-point voltage, which is $V_{IN} - V_{SP}$, but is here being implemented as $V_{IN} + (-V_{SP})$. In this preferred embodiment, the first operational amplifier is an inverting amplifier with a single input terminal. In the case where the first operational amplifier is half of dual operational amplifiers in an integrated circuit package, and both have a differential input stage, the noninverting input terminal is connected to circuit ground to change the configuration of the amplifier to one having a single input terminal, as shown.

The function of the rectifying diodes $D_1$ and $D_2$ is to convert the voltage adding circuit comprising the operational amplifier 10 from a positive current feedback configuration when the input is negative with respect to the set point to a negative current feedback configuration, when the input is positive with respect to the set point, as shown in respective equivalent circuit diagrams of FIGS. 3 and 4. The junction of the blocking diode and the feedback resistor is, in each configuration, connected to a different input terminal of the operational amplifier which has both an inverting (−) and a noninverting (+) input terminal.

In the configuration of FIG. 4 for a positive sum of an input signal and the set point at the junction 13, the diode $D_1$ (FIG. 1) is effectively removed from the circuit, and the inverting input of the operational amplifier 11 is referenced to virtual ground through the feedback resistor 12. In the equivalent circuit diagram shown in FIG. 4, the diode $D_1$ is removed and the feedback resistor 12 is shown connected to circuit ground since virtual ground is within a few millivolts of circuit ground potential. The noninverting (+) input of the amplifier 11 is driven negative through the low forward-conducting impedance of the diode $D_2$. Since the selected window-width voltage is coupled to the same input terminal of the amplifier 11 through a resistor 20 (FIG. 1) having a much higher impedance than the forward-conducting impedance of the diode $D_2$ (e.g., 1k to 10mg), it is a virtual open circuit, i.e., has negligible effect upon circuit operation. Therefore the resistor 20 has been omitted in the equivalent circuit shown in FIG. 4. Since the noninverting input of the amplifier 11 is more negative than the inverting input, the output voltage will be negative as shown at time $T_1$ of FIG. 2. It will remain negative until the difference between the input and the set-point voltage becomes negative at time $T_2$. This example assumes a positive set-point voltage has been selected. At that time the output of the amplifier 11 is driven positive as shown in FIG. 2, and the circuit operation is switched to the configuration shown in the equivalent circuit diagram of FIG. 3.

As long as the effective algebraic difference at the junction 13 remains negative, the inverting input terminal of the amplifier 11 remains positive and the noninverting input remains coupled to the window-width voltage. As long as the positive voltage at the inverting input of the amplifier 11 remains less positive than the window-width voltage at the noninverting input, the output of the amplifier 11 will be positive, as shown for the interval $T_2$ to $T_3$ in the diagram of FIG. 2. In that manner the window-width voltage selected determines how much the input signal may go negative beyond the set-point level before the output voltage will again be driven negative. It should be noted that the setpoint voltage, $+V_{SP}$, in this embodiment is at half the window width more positive than the nominal set-point level desired. The output of the amplifier 11 will thus yield a NO-GO signal until the input signal crosses the actual set-point level, which is equal to the nominal set-point level plus half the window width selected. The output signal will then be at the GO level as long as the input signal is within range of the window width selected, i.e., less than the actual set-point level but greater than the actual set-point level less the window width as shown in FIG. 2.

The set-point level could be selected for some positive input signal by simply adjusting the potentiometer to the appropriate negative set-point voltage $(-V_{SP})$. As soon as the algebraic difference at the junction 13 becomes negative because the positive input signal is now below the positive set-point level, the output of the amplifier 11 will be driven to the GO level. There it will remain until the input signal goes even lower by a increment equal to the window-width set as before.

The polarity of the GO-NO-GO signal may be reversed so that it is at a low (negative) level for the GO condition by simply reversing the connections (polarity) of the diodes $D_1$ and $D_2$, and at the same time moving the window-width coupling resistor 20 to the junction of the diode $D_1$ and the feedback resistor 12, or more simply by reversing the input terminals of amplifier 11.

Although particular embodiments of the invention have been described and illustrated herein, it is recognized that modifications and variations may readily occur to those skilled in the art. For example, the ratio of the ohmic values for the feedback resistor 12 to the coupling resistors 16 and 18 has been selected for unity gain, but may be selected for greater than unity gain for very narrow windows, or for less than unity gain for very wide windows to avoid the necessity of altering the range of window width permitted by the potentiometer 19. In other words decreasing the resistor 12 will increase the window width, and increasing the resistor 12 will decrease the window width, while decreasing the resistor 14 will decrease the window width and increasing the resistor 14 will increase the window width.

I claim:

1. A window comparator comprised of
   a first means for algebraically subtracting an input signal from a selected set-point voltage to produce a difference output indicating when said input signal exceeds a set-point level established by said set-point voltage, said first means being comprised of an operational amplifier having an inverting input terminal connected to a summing junction and two feedback circuits connecting the output of said operational amplifier to said summing junction, one feedback circuit comprising a first diode in series with a resistor, the first diode having its anode connected to the output of the first operational amplifier, and the other feedback circuit comprising a second diode in series with a resistor, the second diode having its cathode connected to the output of said first operational amplifier; a first summing resistor coupling said input signal to said summing junction and a second summing resistor coupling said set-point voltage to said summing junction, said set-point voltag being selected for the set-point level at which the linear output of the first operational amplifier crosses from one polarity to another according to when the algebraic difference between the input signal and the set-point voltage changes polarity, and
   a second means for algebraically subtracting the difference output of said first means from a selected window-width voltage to produce an output signal of a first level until said difference signal indicates said input signal has exceeded said set-point level and, thereafter of a second level until said difference signal exceeds said window-width voltage, at which time said second means produces said output signal of said first level while said difference signal continues to exceed said window-width voltage, said second means being comprised of a high gain differential amplifier having one input terminal connected to the junction between the diode and feedback resistor in one of said feedback circuits and a second input terminal connected to the junction between the diode and feedback resistor in the other one of said feedback circuits, and means for connecting said window-width voltage to one of said two input terminals of said differential amplifier.

2. A window comparator as defined in claim 1 wherein said last named means includes means for selecting said window-width voltage independently of said set-point voltage.

3. A window comparator comprising two operational amplifiers.
   a first operational amplifier with two feedback circuits, each feedback circuit having a diode connected to the same amplifier output terminal and poled for forward current conduction of opposite polarity to provide an algebraic difference between an input signal and a selected set-point voltage such that one diode conducts and then switches off while the other is held off and then conducts according to the sign of the algebraic difference;
   a second operational amplifier having two differential input terminals connected separately to the feedback circuits of the first operational amplifier, one input terminal to the output of one diode, and the other input terminal to the output of the other diode, and
   means for connecting a selected window-width voltage to one of the input terminals of the second operational amplifier to determine when the algebraic difference of the input signal and the set-point voltage has exceeded a predetermined voltage after that difference has changed signs.

4. A window comparator as defined in claim 3 wherein said last named means includes means for selecting said window-width voltage independently of said set-point voltage.

5. A window comparator comprising:

a first operational amplifier having an inverting input terminal connected to a summing junction and two feedback circuits to the summing junction, one feedback circuit comprising a first diode in series with a resistor, the first diode having its anode connected to the output of the first operational amplifier, and the other feedback circuit comprising a second diode in series with a resistor, the second diode having its cathode connected to the output of the first operational amplifier;

a first summing resistor coupling an input signal to said summing junction;

a second summing resistor coupling a set-point voltage to said summing junction, said set-point voltage being selected for the set-point level at which the linear output of the first operational amplifier crosses from one polarity to another according to when the algebraic difference between the input signal and the set-point voltage changes polarity;

a second operational amplifier having two differential input terminals, one an inverting input terminal, and the other a noninverting input terminal;

means for coupling a junction between the diode and feedback resistor in one of said feedback circuits to the inverting input terminal of said second operational amplifier;

means for coupling a junction between the diode and feedback resistor in the other of feedback circuits to the noninverting input terminal of said second operational amplifier;

a resistor coupling a selected window-width voltage to one of said two differential input terminals of said second amplifier to determine when the linear output of the first operational amplifier exceeds the window-width voltage after said input signal crosses said setpoint level by causing the output of said second operational amplifier to switch from a second predetermined voltage level back to a first predetermined voltage level when the output of said first operational amplifier has switched polarity and has exceeded said window-width voltage.

6. A window comparator as defined in claim 5 including means for selecting said window-width voltage independently of said set-point voltage.

* * * * *